United States Patent
Gharpurey et al.

(10) Patent No.: US 6,876,262 B2
(45) Date of Patent: Apr. 5, 2005

(54) TECHNIQUE FOR GENERATING CARRIER FREQUENCIES WITH FAST HOPPING CAPABILITY

(75) Inventors: Ranjit Gharpurey, Plano, TX (US); Anuj Batra, Dallas, TX (US); Jaiganesh Balakrishnan, Dallas, TX (US); Anand G. Dabak, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 76 days.

(21) Appl. No.: 10/626,924

(22) Filed: Jul. 25, 2003

(65) Prior Publication Data

US 2004/0178855 A1 Sep. 16, 2004

Related U.S. Application Data

(60) Provisional application No. 60/453,841, filed on Mar. 11, 2003.

(51) Int. Cl.$^7$ ................................................. H03L 7/16
(52) U.S. Cl. ............................................ 331/25; 331/74
(58) Field of Search ........................... 331/1 A, 18, 25, 331/45, 74–77; 327/115, 117, 118, 156–159; 332/127; 360/51; 375/376; 455/260

(56) References Cited

U.S. PATENT DOCUMENTS 3,612,977 A * 10/1971 Perrett ........................ 318/654

* cited by examiner

*Primary Examiner*—David Mis
(74) *Attorney, Agent, or Firm*—Ronald O. Neerings; Wade James Brady, III; Frederick J. Telecky, Jr.

(57) ABSTRACT

A technique for generating carrier frequencies with fast hopping capability associated with multiband systems for ultra wideband applications. The technique employs a single VCO 20 that is locked in a PLL 30. The output of this VCO 20 is divided in the frequency domain. The divided frequencies thus obtained are combined in a single-sideband manner to obtain various other frequencies. The single-sideband combination requires open loop operations such as multiplication and addition or subtraction to implement, and hence is very fast. The VCO center frequency is not disturbed in the process. Since the required frequencies are generated in an open-loop fashion, instead of inside a PLL, the speed is increased by orders of magnitude.

4 Claims, 1 Drawing Sheet

TECHNIQUE FOR GENERATING CARRIER FREQUENCIES WITH FAST HOPPING CAPABILITY

CLAIM TO PRIORITY OF PROVISIONAL APPLICATION

The application claims priority under 35 U.S.C. § 119(e)(1) of provisional application Ser. No. 60/453,841, entitled A Technique For Generating Carrier Frequencies With Fast Hopping Capability, filed Mar. 11, 2003, by Ranjit Gharpurey, Anuj Batra, Jaiganesh Balakrishnan and Anand Dabak.

BACKGROUND OF THE INVENTION

1. Field of the Invention

This invention relates generally to multiband systems for ultra wideband applications, and more specifically to a technique for generating carrier frequencies with fast hopping capability.

2. Description of the Prior Art

Multiband systems for ultra wideband applications require very fast frequency hopping capability in hardware.

In view of the above, a technique for generating carrier frequencies with fast hopping capability associated with multiband systems for ultra wideband applications would be both advantageous and desirable. It would be further advantageous if the required frequencies were generated orders of magnitude faster than achievable when generating the frequencies inside a phase locked loop (PLL).

SUMMARY OF THE INVENTION

The present invention is directed to a technique for generating carrier frequencies with fast hopping capability associated with multiband systems for ultra wideband applications. The technique employs a single VCO that is locked in a PLL. The output of this VCO is divided in the frequency domain. The divided frequencies thus obtained are combined in a single-sideband manner to obtain various other frequencies. The single-sideband combination requires open loop operations such as multiplication and addition or subtraction to implement, and hence is very fast. The VCO center frequency is not disturbed in the process. Since the required frequencies are generated in an open-loop fashion, instead of inside a PLL, the speed is increased by orders of magnitude.

According to one embodiment, a frequency generator comprises at least one voltage controlled oscillator (VCO) locked in a phase locked loop (PLL), wherein the VCO generates quadrature output signals at a desired center frequency; and a plurality of cascaded divide-by-two divider stages operational to divide the VCO quadrature output signals in the frequency domain and generate a plurality of divided frequency signals.

According to another embodiment, a method of generating carrier frequencies comprises the steps of providing at least one VCO locked in a PLL, wherein the VCO generates quadrature output signals at a desired center frequency, and a plurality of cascaded divide-by-two divider stages; and dividing the VCO quadrature output signals in the frequency domain to generate a plurality of divided frequency signals there from.

BRIEF DESCRIPTION OF THE DRAWINGS

Other aspects and features of the present invention and many of the attendant advantages of the present invention will be readily appreciated as the invention becomes better understood by reference to the following detailed description when considered in connection with the accompanying drawings in which like reference numerals designate like parts throughout the figures thereof and wherein.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

In some applications, as stated herein before, such as a multiband approach to the ultra wideband (UWB) standard, the need exists for very fast hopping carrier frequencies. Hopping rates of the order of nanoseconds are required. A technique is described herein below with reference to FIGS. 1 and 2 that can be used to generate such frequencies. The embodiments described herein below assume that an oscillator is available that provides quadrature outputs at frequency f0.

Figure 1:
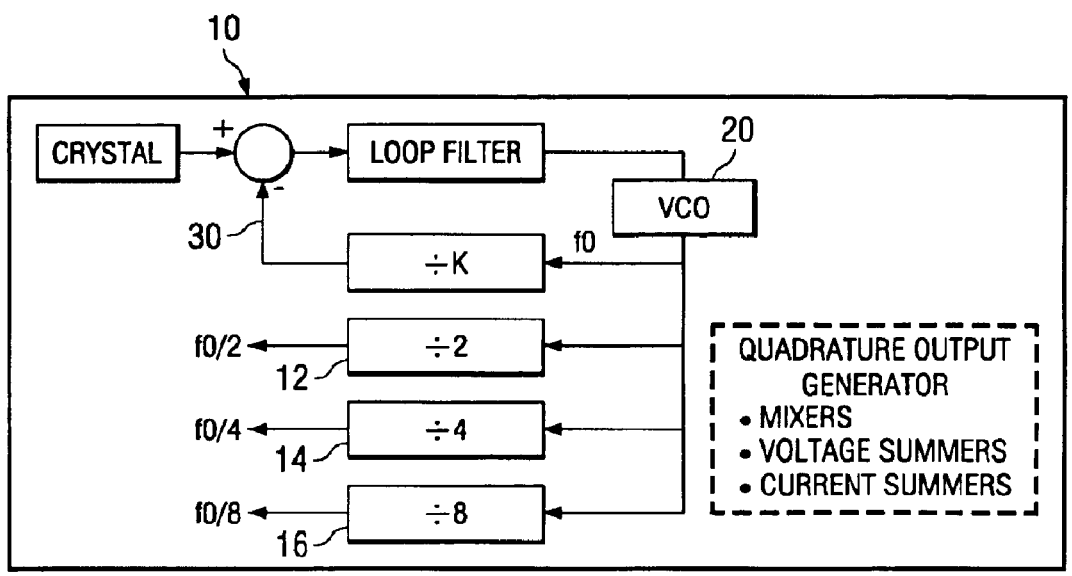
FIG. 1 illustrates a phase locked loop system and derivation of intermediate frequencies according to one embodiment of the present invention.
Figure 2A:
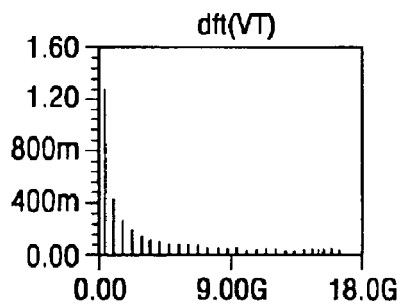
FIGS. 2a–2d depict a set of simulation plots showing a step in frequency for the PLL system shown in FIG. 1.
Figure 2B:
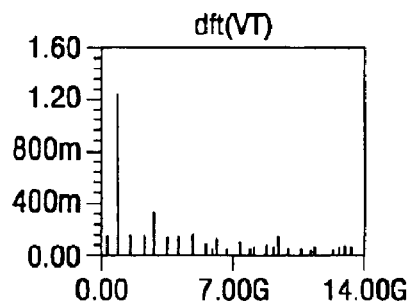
Figure 2C:
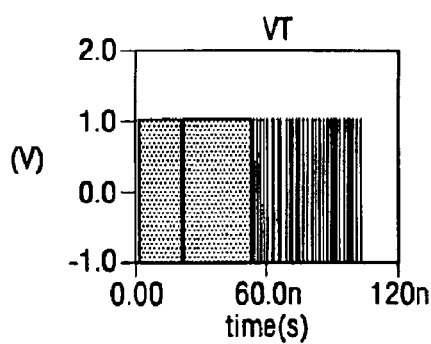
Figure 2D:
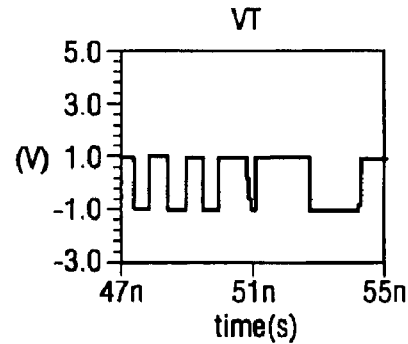

Looking now at FIG. 1, a system 10 for deriving intermediate frequencies can be seen to employ a quadrature VCO 20 in a phase locked loop (PLL) 30. From this frequency, f0, it is possible to generate frequencies f0/2, f0/4, f0/8, f0/16 etc. in a very simple manner by the use of divide-by-2 circuits 12, 14, 16. Those skilled in the art will appreciate that divide-by-2 circuits inherently provide quadrature outputs. Using these frequencies, the required carrier frequencies are generated as described herein below.

If quadrature signals at fa and fb are available, namely Cos(fa), Sin(fa) and Cos(fb) and Sin(fb), frequencies at fa+fb and fa−fb can be generated easily by using the following identities:

$$\text{Cos}(fa) \times \text{Cos}(fb) - \text{Sin}(fa) \times \text{Sin}(fb) = \text{Cos}(fa+fb) \tag{1}$$

$$\text{Cos}(fa) \times \text{Sin}(fb) + \text{Sin}(fa) \times \text{Cos}(fb) = \text{Sin}(fa+fb) \tag{2}$$

and $$\text{Cos}(fa) \times \text{Cos}(fb) + \text{Sin}(fa) \times \text{Sin}(fb) = \text{Cos}(fa-fb) \tag{3}$$

$$\text{Cos}(fa) \times \text{Sin}(fb) - \text{Sin}(fa) \times \text{Cos}(fb) = -\text{Sin}(fa-fb) \tag{4}$$

From the above it can be seen that the generation of frequencies fa+fb and fa−fb requires multiplication and summation that are open-loop operations and thus inherently fast. Signal multiplication in integrated circuits (ICs) is implemented by the use of mixers and addition by the use of voltage or current summers. This is unlike generating these frequencies in a phase locked loop (PLL). Switching from one frequency to the other, in a PLL requires the settling of the PLL, which is usually a slower process than the open loop operation discussed herein above. In the above case, switching from fa+fb to fa−fb or vice versa is accomplished by merely inverting the polarity of the summation or subtraction operation.

From equations (1)–(4), it can be seen that quadrature outputs can be achieved at fa+fb and fa−fb. These tones can thus be reused in a similar single-sideband generation operation to generate quadrature outputs at frequencies such as fa+2fb, fa−2fb, fa+3fb, fa−3fb and in general, m.fa+n.fb, where m and n are integers. If fa>fb, then one can see that several carrier frequencies with a channelization of fb, with fa and multiples of fa as center frequencies, can be generated with rapid transitions from one frequency to the other.

Consider now a hypothetical UWB implementation where the center frequency is 4000 MHz with a channelization of 500 MHz. The center frequency can be divided by 8 and 16, to generate quadrature frequencies at 500 MHz and 250 MHz. From these frequencies one can generate frequencies such as 3250 MHz, 3750 MHz, 4250 MHz, 4750 MHz etc., which are required by the system. Hopping from one frequency to the other is rapid, and with current day technologies can be in achieved within nano-seconds.

Simulation results are illustrated in FIGS. 2a–2d. The simulation results were obtained using a quadrature VCO operating at 5120 MHz followed by 4 cascaded divider stages. The simulation results depict a step in frequency from 960 MHz to 320 MHz, in less than a nanosecond.

This invention has been described in considerable detail in order to provide those skilled in the carrier frequency generation art with the information need to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A frequency generator comprising:
   at least one voltage controlled oscillator (VCO) locked in a phase locked loop (PLL), wherein the VCO generates quadrature output signals at a desired center frequency; and
   a plurality of cascaded divide-by-two divider stages operational to divide the VCO quadrature output signals in the frequency domain and generate a plurality of divided frequency signals.

2. The frequency generator according to claim 1, further comprising a plurality of mixers and a plurality of voltage or current summers, wherein the plurality of mixers and voltage or current summers operate to combine the divided frequency signals in a single-sideband combination to generate open loop output signals at desired frequencies without disturbing the VCO center frequency.

3. A method of generating carrier frequencies, the method comprising the steps of:
   providing at least one VCO locked in a PLL, wherein the VCO generates quadrature output signals at a desired center frequency, and a plurality of cascaded divide-by-two divider stages; and
   dividing the VCO quadrature output signals in the frequency domain to generate a plurality of divided frequency signals there from.

4. The method according to claim 3, further comprising the steps of:
   further providing a plurality of mixers and a plurality of voltage or current summers; and
   combining desired divided frequency signals in a single-sideband combination via the plurality of mixers and the plurality of voltage or current summers, to generate open loop output signals at desired frequencies without disturbing the VCO center frequency.

* * * * *